United States Patent
Noorbakhsh et al.

(10) Patent No.: US 11,424,096 B2
(45) Date of Patent: Aug. 23, 2022

(54) TEMPERATURE CONTROLLED SECONDARY ELECTRODE FOR ION CONTROL AT SUBSTRATE EDGE

(71) Applicant: APPLIED MATERIALS, INC., Santa Clara, CA (US)

(72) Inventors: Hamid Noorbakhsh, Fremont, CA (US); Kartik Ramaswamy, San Jose, CA (US); Anwar Husain, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 470 days.

(21) Appl. No.: 16/674,982

(22) Filed: Nov. 5, 2019

(65) Prior Publication Data

US 2021/0134554 A1  May 6, 2021

(51) Int. Cl.
*H01L 21/683* (2006.01)
*H01J 37/04* (2006.01)
*H01J 37/32* (2006.01)

(52) U.S. Cl.
CPC ........ *H01J 37/04* (2013.01); *H01J 37/32715* (2013.01); *H01L 21/6833* (2013.01); *H01J 2201/32* (2013.01); *H01L 21/6831* (2013.01)

(58) Field of Classification Search
CPC ........................ H01L 21/6831; H01L 21/6833
See application file for complete search history.

(56) References Cited

U.S. PATENT DOCUMENTS

| | | | |
|---|---|---|---|
| 8,633,423 B2* | 1/2014 | Lin | H01L 21/67109 219/465.1 |
| 8,971,009 B2* | 3/2015 | Parkhe | B23Q 3/15 361/234 |
| 9,117,868 B1* | 8/2015 | Nangoy | H01L 21/67207 |
| 2009/0014323 A1* | 1/2009 | Yendler | H01L 21/67069 204/298.33 |
| 2009/0084317 A1 | 4/2009 | Wu et al. | |
| 2013/0001899 A1* | 1/2013 | Hwang | H01L 21/68785 279/128 |

(Continued)

OTHER PUBLICATIONS

U.S. Appl. No. 16/415,723, filed May 17, 2019.
U.S. Appl. No. 16/448,536, filed Jun. 21, 2019.

*Primary Examiner* — Gary A Nash
(74) *Attorney, Agent, or Firm* — Moser Taboada

(57) ABSTRACT

Embodiments of process kits for use in substrate processing chambers are provided herein. In some embodiments, a process kit for use in a substrate processing chamber includes an annular electrode configured to surround an electrostatic chuck, wherein the annular electrode includes an upper portion bonded to a lower portion and an annular channel disposed at an interface between the upper portion and the lower portion; wherein the annular electrode includes a first channel extending from a lower surface of the lower portion to the annular channel and a second channel extending from the lower surface of the lower portion to the annular channel; wherein the annular electrode is configured to flow a coolant from the first channel to the second channel via the annular channel to cool the annular electrode; and wherein the annular electrode includes at least one of a dielectric coating or a ceramic cap to reduce or prevent arcing between the annular electrode and the electrostatic chuck.

20 Claims, 5 Drawing Sheets

(56) References Cited

U.S. PATENT DOCUMENTS

| | | | |
|---|---|---|---|
| 2013/0155568 A1* | 6/2013 | Todorow | H01J 37/32642 |
| | | | 279/128 |
| 2013/0284374 A1* | 10/2013 | Lubomirsky | H01L 21/67103 |
| | | | 361/234 |
| 2014/0268479 A1* | 9/2014 | West | C23C 14/541 |
| | | | 165/185 |
| 2015/0348813 A1* | 12/2015 | Mangalore | H05B 6/105 |
| | | | 219/634 |
| 2018/0233334 A1* | 8/2018 | Luere | H01J 37/32522 |
| 2019/0198298 A1 | 6/2019 | Hirose et al. | |

* cited by examiner

TEMPERATURE CONTROLLED SECONDARY ELECTRODE FOR ION CONTROL AT SUBSTRATE EDGE

FIELD

Embodiments of the present disclosure generally relate to substrate processing equipment, and more specifically, process kits for use with substrate processing equipment.

BACKGROUND

In the current semiconductor manufacturing industry, feature sizes continue to decrease and transistor structures are increasingly complicated. To meet processing demands, advanced processing control techniques are useful to control cost and maximize substrate and die yield. Normally, the dies at the edge of the substrate suffer yield issues such as contact via misalignment, and poor selectivity to a hard mask. One of the causes of these issues is the bending of a plasma sheath near the substrate edge. Process kits having a secondary electrode proximate the substrate edge may be used to control bending of the plasma sheath near the substrate edge. However, the inventors have observed that existing designs of such secondary electrodes are not suitable for high power applications.

Accordingly, the inventors have provided embodiments of improved process kits.

SUMMARY

Embodiments of process kits for use in substrate processing chambers are provided herein. In some embodiments, a process kit for use in a substrate processing chamber includes an annular electrode configured to surround an electrostatic chuck, wherein the annular electrode includes an upper portion bonded to a lower portion and an annular channel disposed at an interface between the upper portion and the lower portion; wherein the annular electrode includes a first channel extending from a lower surface of the lower portion to the annular channel and a second channel extending from the lower surface of the lower portion to the annular channel; wherein the annular electrode is configured to flow a coolant from the first channel to the second channel via the annular channel to cool the annular electrode; and wherein the annular electrode includes at least one of a dielectric coating or a ceramic cap to reduce or prevent arcing between the annular electrode and the electrostatic chuck.

In some embodiments, a process kit for use in a substrate processing chamber includes an annular electrode configured to surround an electrostatic chuck, wherein the annular electrode includes an upper portion bonded to a lower portion and an annular channel disposed at an interface between the upper portion and the lower portion and a first channel fluidly coupled to the annular channel; a dielectric ring coupled to a lower surface of the annular electrode; and a coolant supply line extending through the dielectric ring and partially through the annular electrode to the annular channel.

In some embodiments, a substrate support includes an electrostatic chuck having an electrode embedded therein; and an annular electrode configured to surround the electrostatic chuck, wherein the annular electrode includes an upper portion bonded to a lower portion and an annular channel disposed at an interface between the upper portion and the lower portion; wherein the annular electrode includes an annular channel disposed in at least one of the upper portion and the lower portion; and wherein the annular electrode is configured to flow a coolant through the annular channel to cool the annular electrode; a base plate coupled to the electrostatic chuck and the annular electrode; an dielectric plate disposed between the electrostatic chuck and the base plate to electrically isolate the electrostatic chuck from the base plate; an dielectric ring disposed about the dielectric plate and between the annular electrode and the base plate to electrically isolate the electrostatic chuck from the base plate; and a coolant supply line extending from a bottom surface of the base plate to the annular channel via the dielectric ring.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
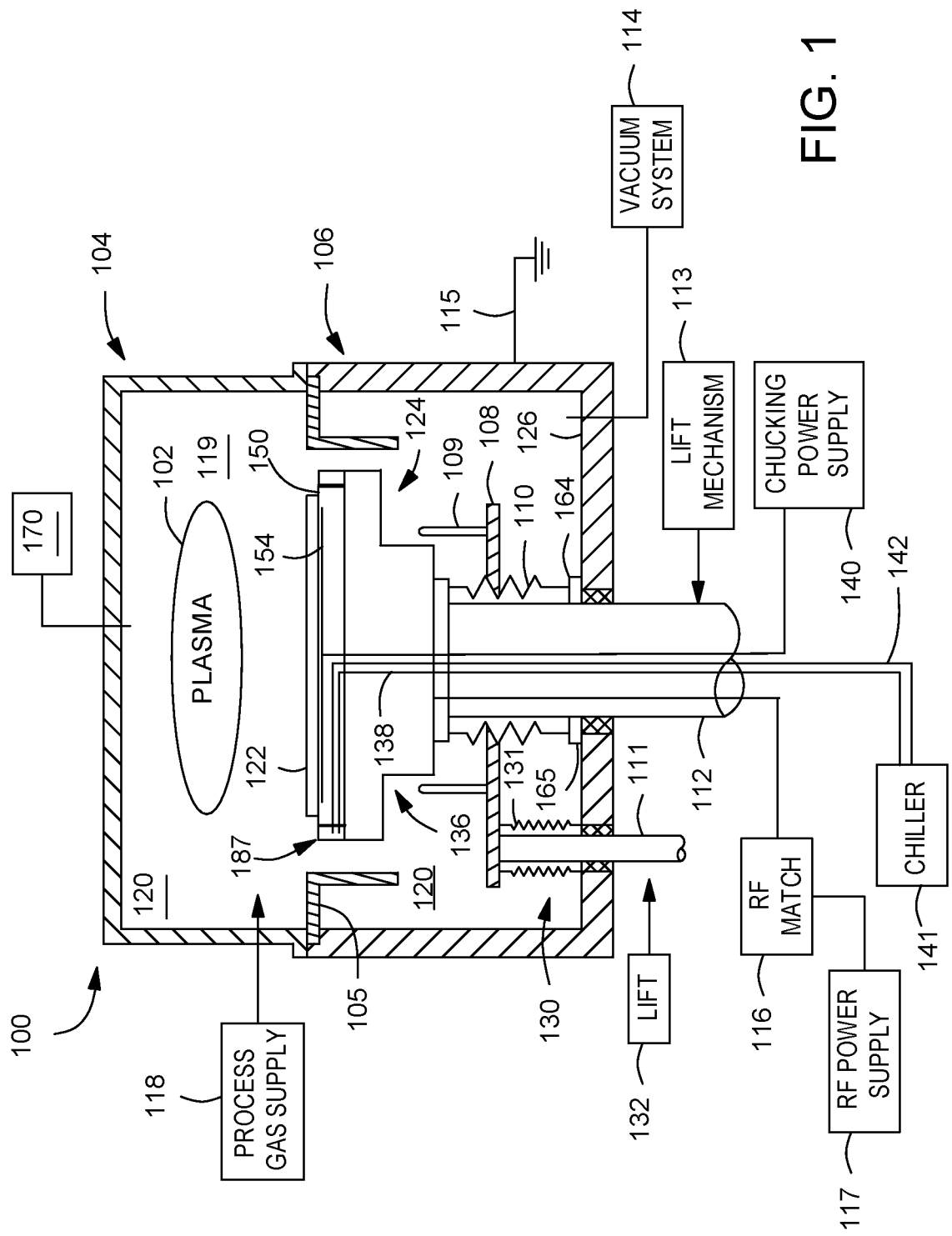
FIG. 1 is a schematic cross-sectional side view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits are provided herein. A process kit includes a secondary electrode, or annular electrode, disposed about an electrostatic chuck to control bending of a plasma sheath near an edge of a substrate being processed in a process chamber. The annular electrode advantageously includes one or more channels to circulate a coolant therethrough to control a temperature of the annular electrode for high power applications.

FIG. 1 is a schematic cross-sectional side view of a process chamber (e.g. a plasma process chamber) in accordance with some embodiments of the present disclosure. In some embodiments, the plasma processing chamber is an etch processing chamber. However, other types of processing chambers configured for different processes can also use or be modified for use with embodiments of the electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate 122, such as a semiconductor wafer, for example, or other such substrate as may be electrostatically retained. The substrate support 124 may generally comprise, a pedestal 136, a process kit 187 about the pedestal 136, and a hollow support shaft 112 for supporting the pedestal 136. The pedestal 136 includes an electrostatic chuck 150. The electrostatic chuck 150 includes one or more electrodes 154 embedded therein. The hollow support shaft 112 provides a conduit to provide, for example, backside gases, process gases, fluids, coolants, power, or the like, to the electrostatic chuck 150.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a coolant supply line 138 and a coolant return line 142 from a chiller 141 to the process kit 187 disposed about the electrostatic chuck 150. The chiller 141 is configured to circulate a coolant through the process kit 187 to cool the process kit 187. The process kit 187 includes an annular electrode coupled to an annular electrode power supply (see FIG. 2). The hollow support shaft 112 provides a conduit for a backside gas supply (not shown), a chucking power supply 140, and RF sources (e.g., RF plasma power supply 170 and RF bias power supply 117) to the electrostatic chuck 150. In some embodiments, RF plasma power supply 170 and RF bias power supply 117 are coupled to the electrostatic chuck 150 via respective RF match networks (only RF match network 116 shown). In some embodiments, the substrate support 124 may alternatively include AC, DC, or RF bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include thru-holes to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes near or within the chamber interior volume 120 to ignite the process gas and creating the plasma 102. A bias power may also be provided from a bias power supply (e.g., RF bias power supply 117) to the one or more electrodes 154 within the electrostatic chuck 150 to attract ions from the plasma towards the substrate 122. Power may also be provided from the annular electrode power supply to the process kit 187 to attract ions from the plasma towards an edge of the substrate 122.

Figure 2:
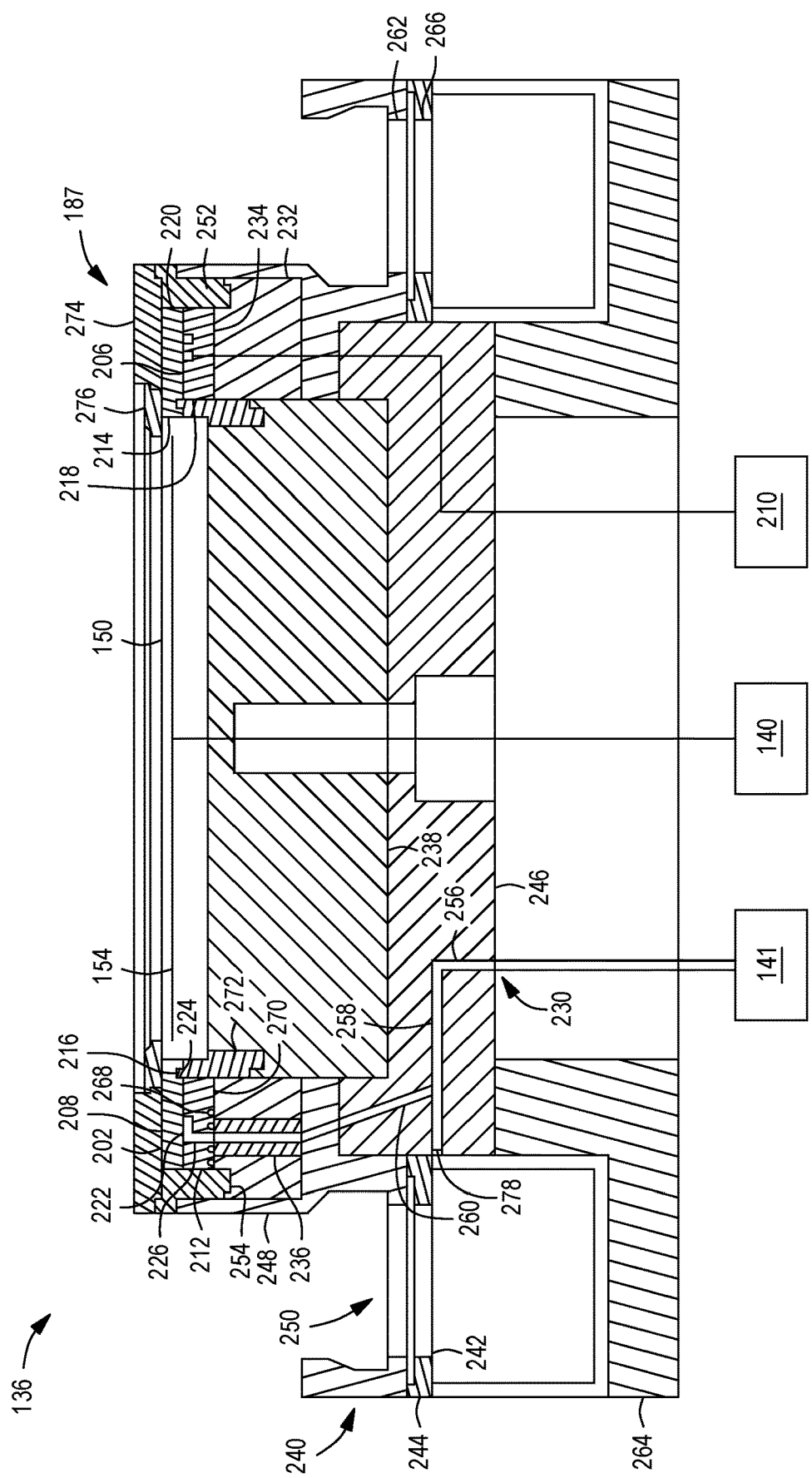
FIG. 2 is a schematic cross-sectional side view of a substrate support in accordance with some embodiments of the present disclosure.

FIG. 2 is a schematic cross-sectional side view of a substrate support 124 in accordance with some embodiments of the present disclosure. A process kit 187 for use in a substrate processing chamber includes an annular electrode 202. The annular electrode 202 is coupled to an annular electrode power supply 210. The annular electrode 202 is configured to surround the electrostatic chuck 150. In some embodiments, the annular electrode 202 is made of aluminum. In some embodiments, the annular electrode 202 includes an upper portion 208 bonded to a lower portion 212. In some embodiments, the upper portion 208 is advantageously diffusion bonded to the lower portion 212 to reduce or prevent leakage therebetween. In some embodiments, an inner surface 214 of the upper portion 208 extends radially inward beyond an inner sidewall 218 of the lower portion 212. In some embodiments, an outer surface of the upper portion 208 is substantially coplanar with an outer surface of the lower portion 212. In some embodiments, a width of the annular electrode 202 as defined between the inner surface 214 and an outermost surface of the annular electrode is about 1.75 inches to about 2.25 inches.

In some embodiments, a dielectric coating 220 covers one or more outer surfaces of the annular electrode 202 to reduce or prevent arcing between the annular electrode 202 and the electrostatic chuck 150. In some embodiments, the dielectric coating 220 comprises yttrium (Y). In some embodiments, an insulator sleeve 272 is disposed between at least a portion of an interface between the electrostatic chuck 150 and the annular electrode 202 to reduce or prevent arcing therebetween. In some embodiments, the insulator sleeve 272 is made of a polymer or other insulative material. In some embodiments, the upper portion 208 includes a notch 216 extending from the lower surface 234 to accommodate the insulator sleeve 272. In some embodiments, the notch 216 is disposed radially outward of the inner surface 214 such that a portion of the annular electrode 202 extends into a notch at an upper peripheral edge of the insulator sleeve 272 to reduce or prevent relative radial movement between the annular electrode 202 and the insulator sleeve 272. In some embodiments, a sidewall 224 defined by the notch 216 is substantially coplanar with an inner sidewall 218 of the lower portion 212.

A dielectric ring 232 is coupled to the lower surface 234 of the lower portion 212. In some embodiments, the dielectric ring 232 is coupled to the annular electrode 202 via one or more fasteners. In some embodiments, the dielectric ring 232 is bonded or clamped to the annular electrode 202. The dielectric ring 232 is disposed about the dielectric plate 238. The dielectric ring 232 is disposed between the annular electrode 202 and a liner 240 to electrically isolate the annular electrode 202 from the liner 240. Is some embodiments, the dielectric ring 232 is made of a ceramic material. In some embodiments, the dielectric ring 232 is made of Rexolite®, commercially available from C-Lec Plastics, Inc. based out of Philadelphia, Pa.

A dielectric plate 238 is disposed between the electrostatic chuck 150 and a base plate 246 to electrically isolate the electrostatic chuck 150 from the base plate 246. In some embodiments, the electrostatic chuck 150 rests on and is coupled to a dielectric plate 238. In some embodiments, the dielectric plate 238 is made of ceramic of Rexolite®. In some embodiments, the dielectric plate 238 rests on and is coupled to a base plate 246. The base plate 246 is coupled to ground (e.g., ground 115). In some embodiments, the base plate 246 is made of aluminum.

In some embodiments, the liner 240 is disposed about and coupled to the dielectric ring 232. In some embodiments, the liner 240 includes upper baffles 242 having a plurality of openings 262. In some embodiments, the liner 240 includes lower baffles 244 having a plurality of openings 266. The upper baffles 242 and the lower baffles 244 are configured to direct a flow of gas through the plurality of openings 262 and the plurality of openings 266, respectively. In some embodiments, the liner 240 includes a lower plate 264 coupled to at least one of the upper baffles 242 and the lower baffles 244. In some embodiments, the lower plate 264 includes a central opening. In some embodiments, the liner 240 is made of aluminum. The liner 240 is coupled to ground (e.g., ground 115). In some embodiments, the upper baffles 242 are disposed between the dielectric ring 232 and the base plate 246. In some embodiments, the base plate 246 is coupled to and disposed between the upper baffles 242 and the lower baffles 244. In some embodiments, the base plate 246 is coupled to the dielectric ring 232 via the upper baffles 242. The dielectric ring 232 is configured to electrically isolate the annular electrode 202 from the liner 240 and the base plate 246.

In some embodiments, the upper baffles 242 include an annular body 250 and an annular lip 248 extending upward from the annular body 250. In some embodiments, the annular lip 248 extends substantially vertically upward from the annular body 250. In some embodiments, the annular lip 248 is disposed about the dielectric ring 232. In some embodiments, the annular lip 248 extends past an upper surface of the dielectric ring 232. In some embodiments, the annular lip 248 is disposed about the annular electrode 202.

In some embodiments, a first ceramic ring 252 is disposed about the annular electrode 202 to reduce or prevent electrical discharge between the annular electrode 202 and the liner 240. In some embodiments, the first ceramic ring 252 is made of quartz. In some embodiments, the first ceramic ring 252 is disposed about both the upper portion 208 and the lower portion 212 of the annular electrode 202. In some embodiments, the first ceramic ring 252 is disposed between the annular lip 248 of the upper baffles 242 and the annular electrode 202. In some embodiments, the first ceramic ring 252 is disposed in an upper peripheral notch 254 of the dielectric ring 232. In some embodiments, a top ring 274 is disposed on the annular electrode 202 to cover the annular electrode 202 and the first ceramic ring 252. In some embodiments, the top ring 274 is made of quartz. In some embodiments, an edge ring 276 is disposed on the electrostatic chuck 150 and extends over the annular electrode 202. In some embodiments, the edge ring 276 is made of material similar to the substrate 122 to facilitate more uniform processing at an edge region of the substrate 122. In some embodiments, the edge ring 276 comprises silicon (Si).

In some embodiments, the annular electrode 202 includes an annular channel 222 disposed in at least one of the upper portion 208 and the lower portion 212. In some embodiments, the annular channel 222 is disposed at an interface between the upper portion 208 and the lower portion 212. The annular channel 222 is configured to flow a coolant (e.g. from chiller 141) therethrough to cool the annular electrode 202.

In some embodiments, the coolant supply line 230 extends partially through the annular electrode 202 to the annular channel 222. In some embodiments, the annular electrode 202 includes a first channel 226 extending from a lower surface 234 of the lower portion 212 to the annular channel 222 to fluidly couple the first channel 226 to the annular channel 222. The coolant supply line 138 extends from the chiller 141 to the annular channel 222 via the base plate 246, the upper baffles 242, the dielectric ring 232, and the first channel 226. The coolant return line 142 extends from the annular channel 222 to the chiller 141 via a second channel (see FIG. 5) that extends from the annular channel 222 to the lower surface 234 of the lower portion 212, the dielectric ring 232, the upper baffles 242, and the base plate 246 The annular electrode 202 is configured to flow a coolant from the first channel 226 to the second channel via the annular channel 222 to cool the annular electrode 202.

In some embodiments, the coolant supply line 138 that extends through the base plate 246 includes a first segment 256 extending from a lower surface of the base plate 246 to a second segment 258. In some embodiments, the first segment 256 is substantially vertical. In some embodiments, the second segment 258 extends from an outer sidewall of the base plate 246 to the first segment 256. In some embodiments, a plug 278 is disposed in the second segment 258 at the outer sidewall of the base plate 246 to prevent leakage of coolant from the outer sidewall of the base plate 246. In some embodiments, the second segment 258 is substantially horizontal. In some embodiments, a third segment 260 extends from the second segment 258 to an upper surface of the base plate 246. In some embodiments, the third segment 260 extends at a first angle with respect to the second segment 258. In some embodiments, the third segment 260 extends upward and radially outward from the second segment 258. In some embodiments, the coolant supply line 138 extends through the upper baffles 242 at an angle with respect to the second segment 258 similar to the first angle. The coolant return line 142 may extend through the base plate 246 similarly to the coolant supply line 138.

In some embodiments, a ceramic sleeve 236 is disposed in the dielectric ring 232 about the coolant supply line 230. The ceramic sleeve 236 is configured to provide thermal insulation for the dielectric ring 232. In some embodiments, the lower portion 212 of the annular electrode 202 includes one or more o-ring grooves 268 configured to accommodate one or more o-rings to reduce or prevent leakage of coolant between the annular electrode 202 and the dielectric ring 232. The one or more o-rings grooves 268 are disposed about the coolant supply line 230. In some embodiments, a thermal isolation layer 270 is disposed between the annular electrode 202 and the dielectric ring 232 to reduce or prevent thermal transfer between the annular electrode 202 and the dielectric ring 232. In some embodiments, the thermal isolation layer 270 comprises a gap of about 2 to 10 mil between the lower portion 212 and the dielectric ring 232.

Figure 3:
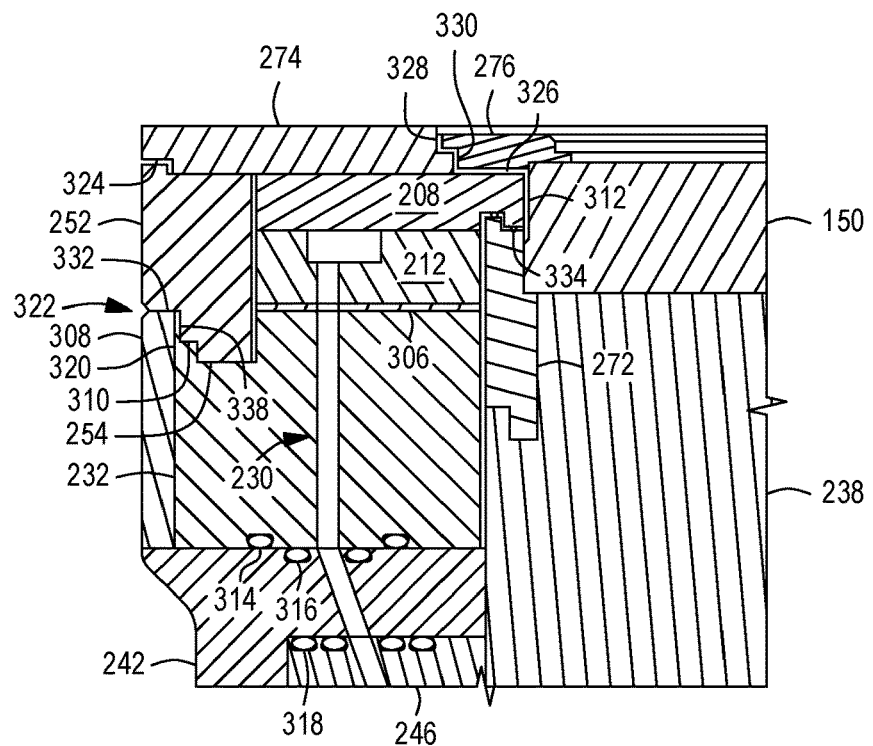
FIG. 3 is a partial cross-sectional side view of a substrate support in accordance with some embodiments of the present disclosure.

FIG. 3 is a partial cross-sectional side view of a substrate support in accordance with some embodiments of the present disclosure. In some embodiments, as shown in FIG. 3, the lower portion 212 is bonded to the dielectric ring 232. In some embodiments, a bond layer 306 between the lower portion 212 and the dielectric ring 232 has a thickness of about 10 mil to about 30 mil. In such embodiments, the coolant supply line 230 includes a direct drilled hole in the dielectric ring 232. In some embodiments, where the dielectric ring 232 is bonded to the annular electrode 202, a dielectric coating covers one or more outer surfaces of the dielectric ring 232 to reduce or prevent arcing between the annular electrode 202 and the liner 240. In some embodiments, the dielectric coating comprises yttrium (Y).

In some embodiments, the annular lip 248 of the upper baffles 242 may be replaced with a second ceramic ring 308 to increase a distance between annular electrode 202 and the upper baffles 242 that is grounded. In some embodiments, the second ceramic ring 308 is disposed about the dielectric ring 232. In some embodiments, the second ceramic ring 308 is partially disposed about the first ceramic ring 252. In some embodiments, the second ceramic ring 308 has a substantially constant thickness from an outer surface to an inner surface. In some embodiments, the outer surface of the second ceramic ring 308 is coplanar with an outer surface of the first ceramic ring 252. In some embodiments, a lower surface of the second ceramic ring 308 is coplanar with a lower surface of the dielectric ring 232.

In some embodiments, the dielectric ring 232 includes one or more o-ring grooves 314 configured to accommodate one or more o-rings to reduce or prevent leakage of coolant between the liner 240 and the dielectric ring 232. In some embodiments, the upper baffles 242 of the liner 240 includes one or more o-ring grooves 316 configured to accommodate one or more o-rings to reduce or prevent leakage of coolant between the liner 240 and the dielectric ring 232. In some embodiments, the base plate 246 includes one or more o-ring grooves 318 configured to accommodate one or more o-rings to reduce or prevent leakage of coolant between the base plate 246 and the upper baffles 242. The one or more o-rings grooves 314, 316, 318 are disposed about the coolant supply line 230.

In some embodiments, the first ceramic ring 252 includes a first step 310 at a lower peripheral edge. In some embodiments, the dielectric ring 232 includes a lip 320 extending from an upper peripheral edge of the dielectric ring 232 and configured to extend into the first step 310 to retain the first ceramic ring 252 in the upper peripheral notch 254 of the dielectric ring 232. In some embodiments, the first ceramic ring 252 includes a second step 338 at a lower peripheral edge. An upper portion 322 of the second ceramic ring 308 is disposed in the second step 338. In some embodiments, a gap is disposed between an inner surface of the second ceramic ring 308 and an outer surface of the first ceramic ring 252 defined by the second step 338. In some embodiments, as shown in FIG. 3, the second step 338 extends from the first step 310 to below a lower surface of the annular electrode 202. In some embodiments, the second step 338 extends from the first step 310 to above a lower surface of the annular electrode 202 (See FIG. 4).

In some embodiments, the top ring 274 includes a notch 324 at a lower peripheral edge. In some embodiments, the first ceramic ring 252 extends into the notch 324 to retain the top ring 274 between the first ceramic ring 252 and the edge ring 276. In some embodiments, the top ring 274 includes a second notch 328 at an inner peripheral edge to mate with the edge ring 276. In some embodiments, the edge ring 276 includes a notch 330 at a lower peripheral edge to mate with the top ring 274. The edge ring 276 is disposed on the electrostatic chuck 150. In some embodiments, a first gap 312 is disposed between the inner surface 214 of the annular electrode 202 and an outer surface of the electrostatic chuck 150 to reduce or prevent arcing therebetween. In some embodiments, one or more o-rings 334 are disposed between the upper portion 208 and the insulator 272 to provide a seal therebetween. In some embodiments, a second gap 326 is disposed between an upper surface of the annular electrode 202 and the edge ring 276. In some embodiments, the second gap 326 is about 0.25 mm to about 0.75 mm.

Figure 4:
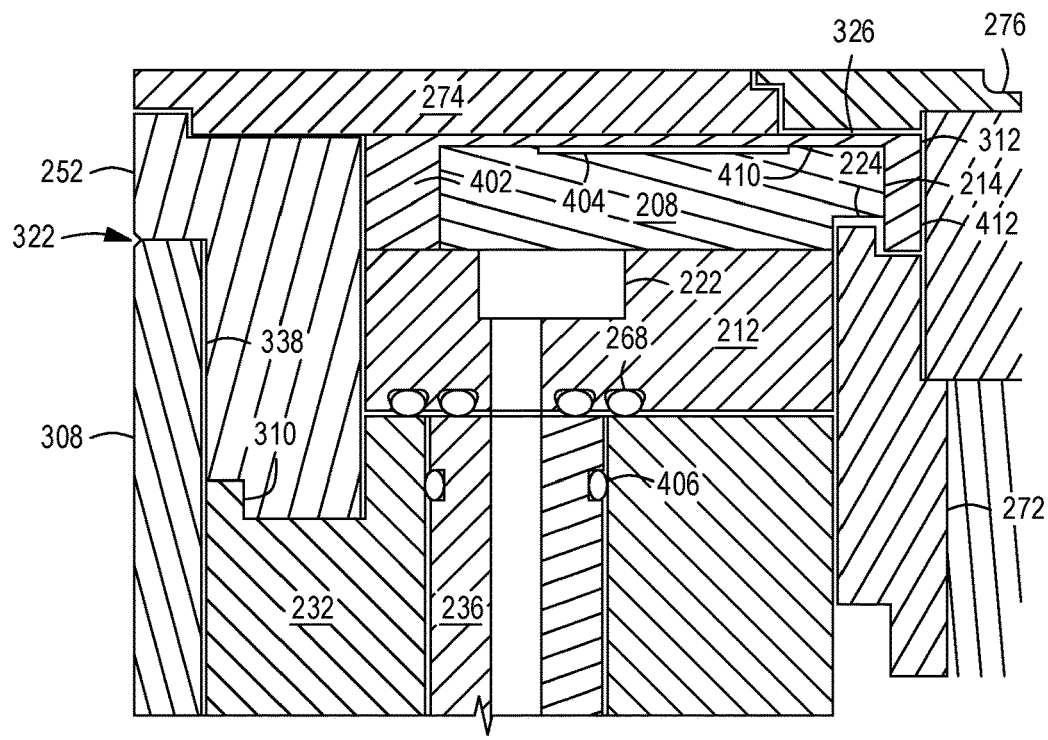
FIG. 4 is a partial cross-sectional side view of a substrate support in accordance with some embodiments of the present disclosure.

FIG. 4 is a partial cross-sectional side view of a substrate support in accordance with some embodiments of the present disclosure. In some embodiments, the annular electrode 202 includes a ceramic cap 402 having an annular shape surrounding the upper portion 208 of the annular electrode 202. In such embodiments, a width of an upper surface of the upper portion 208 may be reduced to advantageously control bending of the plasma sheath near an edge of the substrate 122 during processing. In some embodiments, the ceramic cap 402 is bonded to the upper portion 208. In some embodiments, a bond layer 404 is has a thickness of about 0.25 to about 0.75 mm. In some embodiments, the bond layer 404 extends along a portion of the upper surface of the upper portion 208. In some embodiments, a distance between an upper surface of the upper portion 208 and an upper surface of the ceramic cap 402 is about 1.0 mm or less.

The ceramic cap 402 includes a lower surface having a recess 410 to accommodate the upper portion 208. In some embodiments, the ceramic cap 402 covers the upper surface of the upper portion 208 and sidewalls of the upper portion 208. In some embodiments, the upper portion 208 is entirely disposed within the recess 410. In some embodiments, an outer diameter of the ceramic cap 402 is substantially the same as an outer diameter of the lower portion 212. In some embodiments, the lower portion 212, the upper portion 208, and the ceramic cap 402 define a size and shape similar to the annular electrode 202 depicted in FIGS. 2 and 3.

The ceramic cap 402 also advantageously provides additional space between the electrostatic chuck 150 and the annular electrode 202 to reduce or prevent arcing therebetween. For example, a distance between an inner surface 214 of the upper portion 208 and an inner surface of the ceramic cap 402 is about 3.0 mm to about 4.0 mm. In some embodiments, the ceramic sleeve 236 includes one or more o-ring grooves 406 on an outer sidewall configured to accommodate one or more o-rings to reduce or prevent leakage of coolant between the dielectric ring 232 and the ceramic sleeve 236.

Figure 5:
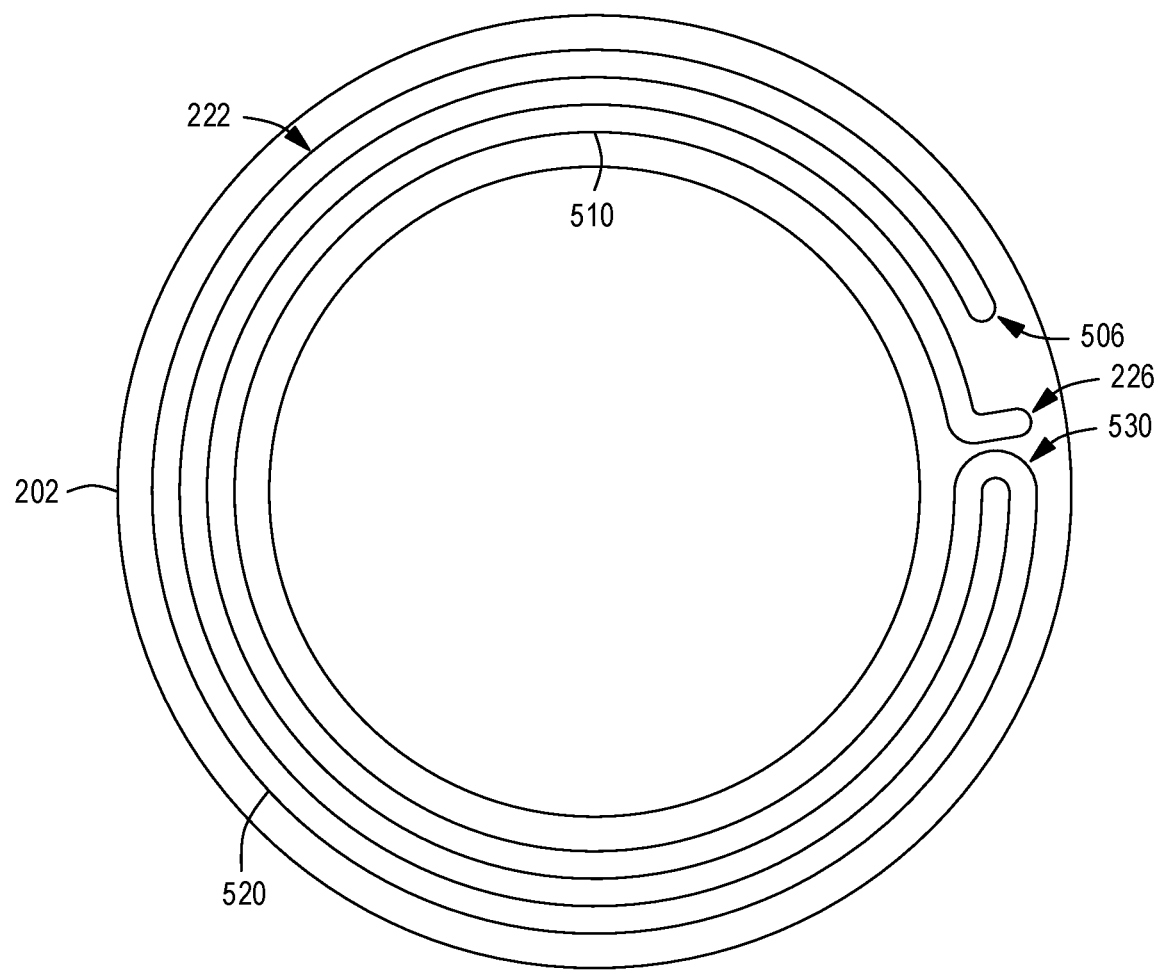
FIG. 5 is a schematic top view of a portion of a process kit in accordance with some embodiments of the present disclosure.

FIG. 5 is a schematic top view of an annular electrode in accordance with some embodiments of the present disclosure. In some embodiments, the annular channel 222 comprises a first annular portion 510 and a second annular portion 520. In some embodiments, the first annular portion 510 is coupled to the second annular portion 520 via a u-shaped portion 530. In some embodiments, the first annular portion 510 is configured to flow a coolant in a direction opposite the second annular portion 520 to advantageously increase thermal coupling between the annular channel 222 and the annular electrode 202.

Figure 6:
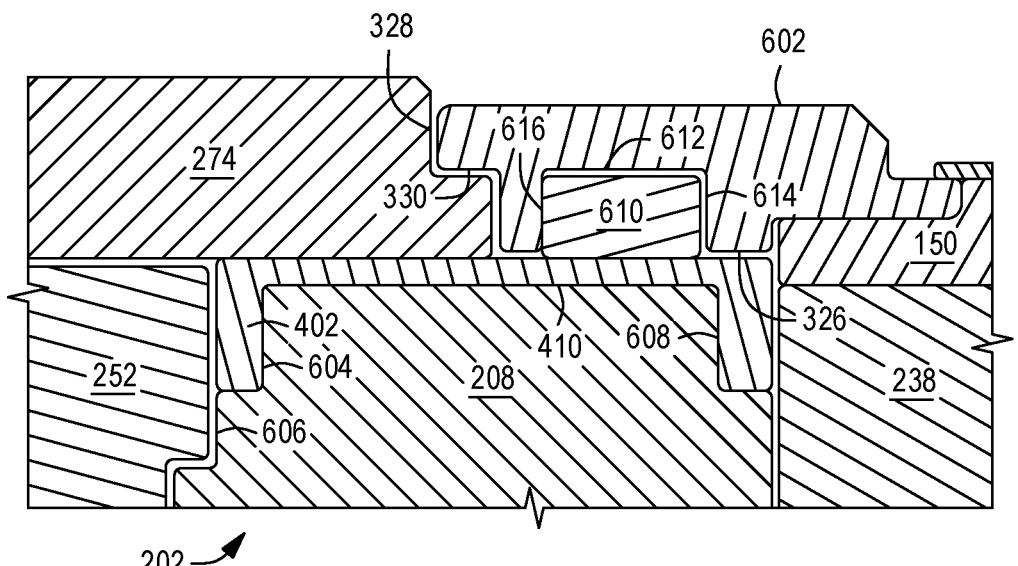
FIG. 6 is a partial cross-sectional side view of a substrate support in accordance with some embodiments of the present disclosure.

FIG. 6 is a partial cross-sectional side view of a substrate support in accordance with some embodiments of the present disclosure. An edge ring 602 is disposed on the electrostatic chuck 150 and extends over the annular electrode 202 with the second gap 326 therebetween. In some embodiments, the edge ring 602 includes a recess 612 extending from a lower surface of the edge ring 602 (e.g., annular electrode facing surface). In some embodiments, an insert ring 610 is disposed on the annular electrode 202 (e.g., the upper portion 208 or the ceramic cap 402) and in the recess 612. In some embodiments, the inert ring 610 has a rectangular cross-sectional shape. The recess 612 defines an inner sidewall 614 and an outer sidewall 616. In some embodiments, a distance between the inner sidewall 614 and the outer sidewall 616 is about 0.2 in to about 0.4 in.

Figure 7:
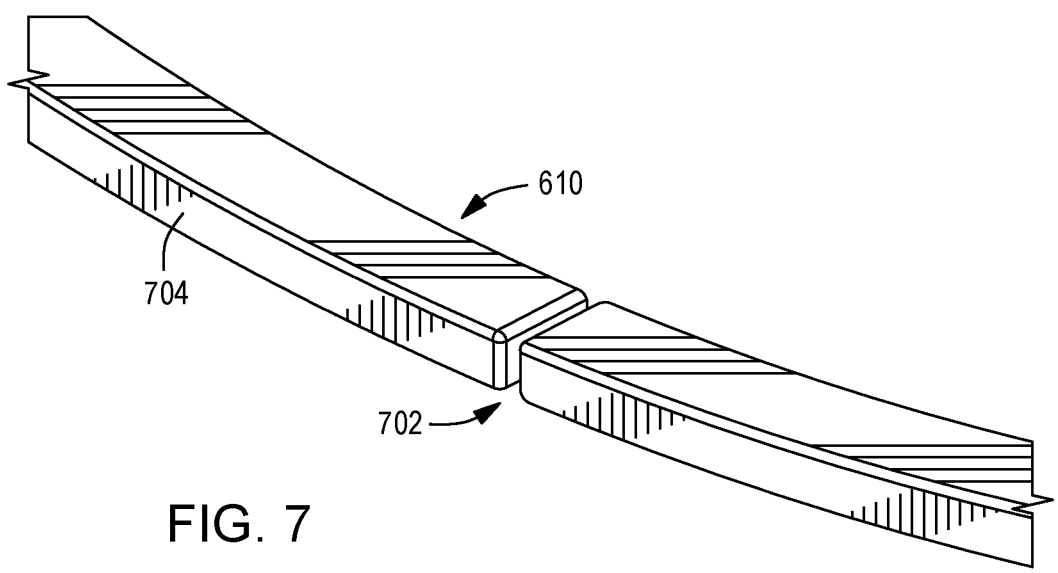
FIG. 7 is a partial isometric top view of a process kit component in accordance with some embodiments of the present disclosure.

In some embodiments, as shown in FIG. 7, the insert ring 610 advantageously includes a slit 702 disposed therethrough so that the insert ring 610 acts as a radial spring when compressed. In some embodiments, an outer diameter of the insert ring 610, when uncompressed, is greater than a diameter defined by the outer sidewall 616 so that the insert ring 610 is compressed when inserted into the recess 612. The insert ring 610, when compressed, acts like a spring and expands radially outward to contact the outer sidewall 616 of the edge ring 602 to maintain electrical contact for RF coupling between the annular electrode 202 and the edge ring 602.

In some embodiments, as shown in FIG. 6, the upper portion 208 is partially disposed in the recess 410 of the ceramic cap 402. In some embodiments, the upper portion 208 of the annular electrode 202 includes a first step 604 at an upper peripheral edge to accommodate the ceramic cap 402. In some embodiments, the upper portion 208 includes a second step 606 at an upper peripheral edge to accommodate the first ceramic ring 252.

While the foregoing is directed to embodiments of the present disclosure, other and further embodiments of the disclosure may be devised without departing from the basic scope thereof.

The invention claimed is:

1. A process kit for use in a substrate processing chamber, comprising:
   an annular electrode configured to surround an electrostatic chuck, wherein the annular electrode includes an upper portion bonded to a lower portion and an annular channel disposed at an interface between the upper portion and the lower portion; wherein the annular electrode includes a first channel extending from a lower surface of the lower portion to the annular channel and a second channel extending from the lower surface of the lower portion to the annular channel; wherein the annular electrode is configured to flow a coolant from the first channel to the second channel via the annular channel to cool the annular electrode; and wherein the annular electrode includes at least one of a dielectric coating or a ceramic cap to reduce or prevent arcing between the annular electrode and the electrostatic chuck.

2. The process kit of claim 1, wherein an inner surface of the upper portion extends radially inward beyond an inner surface of the lower portion.

3. The process kit of claim 1, wherein the annular channel is disposed in the lower portion.

4. The process kit of claim 1, wherein the annular electrode is made of aluminum.

5. The process kit of claim 1, wherein the upper portion includes a notch extending from the lower surface, and wherein a sidewall defined by the notch is substantially coplanar with an inner sidewall of the lower portion.

6. The process kit of claim 1, wherein the ceramic cap surrounds the upper portion.

7. The process kit of claim 6, wherein a distance between an upper surface of the upper portion and an upper surface of the ceramic cap is about 1.0 mm or less.

8. The process kit of claim 6, wherein a distance between an inner surface of the upper portion and an inner surface of the ceramic cap is about 3.0 mm to about 4.0 mm.

9. A process kit for use in a substrate processing chamber, comprising:
   an annular electrode configured to surround an electrostatic chuck, wherein the annular electrode includes an upper portion bonded to a lower portion and an annular channel disposed at an interface between the upper portion and the lower portion and a first channel fluidly coupled to the annular channel;
   a dielectric ring coupled to a lower surface of the annular electrode; and
   a coolant supply line extending through the dielectric ring and partially through the annular electrode to the annular channel.

10. The process kit of claim 9, wherein the annular electrode includes a ceramic cap surrounding the upper portion.

11. The process kit of claim 9, further comprising a quartz ring disposed on the annular electrode.

12. The process kit of claim 9, further comprising a ceramic sleeve disposed in the dielectric ring about the coolant supply line.

13. The process kit of claim 9, further comprising a first ceramic ring disposed about both the upper portion and the lower portion of the annular electrode.

14. The process kit of claim 9, further comprising an edge ring disposed on the electrostatic chuck and having a recess, wherein an insert ring is disposed is the recess and on the annular electrode.

15. The process kit of claim 14, wherein the insert ring includes a slit disposed therethrough so that the insert ring acts as a radial spring when compressed.

16. A substrate support, comprising:
   an electrostatic chuck having an electrode embedded therein; and
   an annular electrode configured to surround the electrostatic chuck, wherein the annular electrode includes an upper portion bonded to a lower portion and an annular channel disposed at an interface between the upper portion and the lower portion; wherein the annular electrode includes an annular channel disposed in at least one of the upper portion and the lower portion; and wherein the annular electrode is configured to flow a coolant through the annular channel to cool the annular electrode;
   a base plate coupled to the electrostatic chuck and the annular electrode;
   a dielectric plate disposed between the electrostatic chuck and the base plate to electrically isolate the electrostatic chuck from the base plate;
   a dielectric ring disposed about the dielectric plate and between the annular electrode and the base plate to electrically isolate the electrostatic chuck from the base plate; and a coolant supply line extending from a bottom surface of the base plate to the annular channel via the dielectric ring.

17. The substrate support of claim 16, further comprising a thermal isolation layer between the annular electrode and the dielectric ring.

18. The substrate support of claim 16, wherein the annular electrode includes a ceramic cap surrounding the upper portion.

19. The substrate support of claim 16, further comprising a liner disposed about the dielectric ring and between the dielectric ring and the base plate.

20. The substrate support of claim 19, further comprising a first ceramic ring disposed between the annular electrode and the liner.

* * * * *